United States Patent [19]
White

[11] Patent Number: 5,217,831
[45] Date of Patent: Jun. 8, 1993

[54] SUB-MICRON DEVICE FABRICATION

[75] Inventor: Donald L. White, Lake Parsippany, N.J.

[73] Assignee: AT&T Bell Laboratories, Murray Hill, N.J.

[21] Appl. No.: 673,626

[22] Filed: Mar. 22, 1991

[51] Int. Cl.⁵ .............................................. G03F 9/00
[52] U.S. Cl. ........................................ 430/5; 430/4; 430/311
[58] Field of Search ............................. 430/5, 4, 311

[56] References Cited

U.S. PATENT DOCUMENTS 5,045,417  9/1991  Okamoto ............................. 430/5
5,091,979  2/1992  White ................................. 385/1

OTHER PUBLICATIONS

M. D. Levenson, et al., *IEEE Trans. Electron Devices*, v. ED-29 (12), p. 1828 (1982).
L. E. Stillwagon & R. G. Larson, "Fundamentals of Topographic Substrate Leveling", *J. Appl. Phys.*, vol. 63 (11), Jun. 1, 1988, p. 5251.
Reynolds, DeVelis, Parrent, Thompson, "Physical Optics Notebook", *Tutorial in Fourier Optics*, pub. SPIE Optical Engineering Press, p. 27 (1989).
L. F. Thompson, et al., "Introduction to Microlithography", *ACS Symposium Series*, p. 73 (1983).

*Primary Examiner*—Marion E. McCamish
*Assistant Examiner*—Mark A. Chapman
*Attorney, Agent, or Firm*—G. S. Indig

[57] ABSTRACT

Expedient fabrication of phase masks providing for many values of phase delay for exiting pattern delineating radiation depends upon a two-step procedure. Such masks offer improvement in ultimate device fabrication relative to that offered by prior binary-valued masks. In the first step, which may be carried out coincident with introduction of device feature information, apertures of appropriate size and distribution are produced in the relevant mask layer; in the second step material surrounding such apertures is heated to result in backflow-filling. The consequential layer thinning is such as to introduce the desired local change in phase delay.

23 Claims, 4 Drawing Sheets

SUB-MICRON DEVICE FABRICATION

BACKGROUND OF THE INVENTION

1. Technical Field

The invention relates to the fabrication of small-dimensioned devices, e.g. integrated circuits using sub-micron design rules and to appartus/tools used in such fabrication. While implications are broad, a major thrust concerns lithographic delineation-the use of phase masks to improve image quality. Whether based on presently used delineating energy, e.g. in the near ultraviolet spectrum, or on shorter wavelength, e.g. in the deep ultraviolet or x-ray spectrum, improvement in lithographic delineation extends the range to permit further miniaturization. Fabrication of Very Large Scale Integrated circuits-electronic as well as optical and hybrid-built to sub-micron design rules-is contemplated.

2. Description of the Prior Art

The saga of Large Scale Integration from inception to the present time is well-known. Evolution of the present 1-2 megabit chip, built to design rules at or slightly below 1 μm, does not represent the ultimate product. Lithographic definition has played, and will continue to play, a significant role. Fabrication of state-of-the-art devices depends on use of near-ultraviolet radiation (e.g. of wavelength, $\lambda = 3650$ Å-the mercury I line). Intensive effort directed toward next generation devices is expected to depend on radiation of still shorter wavelength (radiation within the "deep UV" spectrum, e.g. of wavelength, $\lambda = 2480$ Å-the krypton fluoride excimer laser line). Forward-looking work directed toward still smaller design rules contemplates electromagnetic energy in the x-ray spectrum or, alternatively, accelerated electron radiation of equivalent decreased wavelength.

A competing effort seeks to extend the capability of presently used UV delineating radiation. As described by M. D. Levenson et al, in *IEEE Trans. Electron Devices*, vol. ED-29 (12), p. 1828 (1982) and as reviewed in a New York Times article dated Dec. 12, 1990, design rule-limiting edge resolution is lessened by use of "phase masks"-that is, masks designedly providing for relative phase shifting of radiation as transmitted through selected mask areas. Impact is two-fold: (1) as applied to usual device fabrication entailing opaque featured masks (e.g. chrome on glass); and (2) as applied to such fabrication entailing clear masks, dispensing with opaque mask features, in which use is made of dark-line imaging resulting from interference as between transparent mask regions of differing phase delay. In either event, use of phase masks permits extension to design rules generally thought beyond the capability of the particular wavelength used with extension due to phase cancellation of diffraction-scattered radiation at feature edges. In both instances, provision is made for 180° phase shift regions-either adjacent, or as an integral part of edge-defining mask areas.

Phase masking is considered promising in accordance with traditional business considerations. It permits fabrication of next-generation devices using present equipment and processing. Avoidance of cost of replacement equipment (in any event not yet commercially available) as well as of retaining of personnel, assures continuing effort in this direction.

A widespread view serves as basis for expected extension of Uv-based processing to design rules below 0.3-0.25 μm by use of phase masking-likely to the 0.2 μm and below range commonly thought beyond the effective capability of UV delineation. To the extent that this proves to be correct, device fabrication by use of x-ray (whether proximity or projection) as well as by use of accelerated electron radiation (whether by beam writing or masking), is likely to be deferred to the turn of the century.

Limiting lithographic resolution varies in accordance with the classical relationship:

$$\text{Resolution} = \frac{K_1 \lambda}{NA}$$

in which:
- $\lambda$ = wavelength of delineating radiation in appropriate units, e.g. μm
- NA is the numerical aperture of the optical system
- Resolution is on the basis of desired feature-space contrast and
- $K_1$ is a constant which depends upon details of the imaging system and characteristics of the delineating process, e.g. of the development process—a value of 0.7-0.8 is representative of state-of-the-art fabrication (of 0.8-1.0 μm design rule LSI)

180° phase mask processing for given wavelength/etch contrast may be described in terms of reduction of $K_1$ to the $\approx 0.5$ level (permitting fabrication of devices to design rule of $\approx 0.4$ μm), and in some instances to the $K_1 \approx 0.3$ level to yield quarter micron features.

SUMMARY OF THE INVENTION

The invention is concerned with device fabrication involving at least one level of pattern delineation dependent on image transfer from mask to device in fabrication. The fundamental thrust entails use of a mask designedly providing for a plurality of values of phase delay and amplitude of delineation radiation with the object of improving image quality—e.g. improving edge resolution of imaged features. While edge resolution is improved independent of feature size, the advance is of particular consequence for small features—particularly for closely spaced small features. Accordingly, a primary purpose of the invention entails fabrication of submicron design rule features, generally as contained in Integrated Circuits. Relevant approaches are directed to use of device design rules smaller than usually contemplated as expediently attainable for particular delineating radiation. Design approaches, generic to the present invention, are described in co-filed U.S. patent application Ser. No. 07/673,614, and such application is hereby incorporated by reference. The co-filed application describes circuit design approaches of particular significance as implemented in accordance with this invention. While not so limited, examples of particular consequence concern interference-generated image features. Such examples include line termination as well as line branching in which facility for many-valued magnitudes of phase delay are utilized. In addition, feature spacing, sometimes compromised by the phase mask approach, is significantly improved by generation of closely spaced adjacent features by different phase delay values of paired defining radiation.

It is observed in the co-filed application that provision for 180° phase masking as described in the literature (see preceding section), while offering significant improvement in resolution, may be further improved. This literature-described approach is based upon phase cancellation on the assumption that energy to be cancelled is of uniform phase. This assumption does not take into account phase delay which is introduced in the course of imaging, e.g. through proximity effects of closely spaced features. Such variation from the nominal constant-phase image is of increasing significance for circuitry of decreasing design rules. Actual pattern wave fronts of contemplated sub-micron design rule devices are characterized by a variety—often a continuum—of phase variation. Since unwanted radiation emanating from the mask, e.g. diffraction-edge scattered radiation, may reflect such phase variation, accommodation in terms of phase cancellation should take this into account. Total cancellation continues to require energy which is 180° out of phase—but which is out of phase with regard to the locally scattered energy to be lessened (rather than at the uniform fixed 180° phase delay relative to the nominal phase of the hypothetical uniform pattern wave front which ignores proximity and other perturbing effects).

In terms of mask construction, the above objectives require provision for phase change at at least two levels—ideally facility for provision of a phase continuum or near-continuum (e.g. with successive values separated by 5° or 10°). Variation may take the form of change in thickness and/or refractive index of mask layer material through which patterning energy is transmitted, or, alternatively, of the equivalent for masks operating in surface reflection mode. Phase delay of invention may be provided in reflection masks in a number of ways either separately or in combination. Required local variation in the length of the phase path may take the form of: relief changes of the free reflecting surface; of variation in penetration depth in a transparent layer to a reflecting surface for incident radiation; of variation in refractive index in such a layer. Such masks, whether transmission or reflection mode, designedly providing for three or more levels of phase delay for cancellation/lessening of unwanted radiation are here referred to as Multi Phase delay Masks.

Construction of MPMs by extension of procedures used for selective removal/retention of mask layer regions of unaltered (of total) thickness as practiced in literature-described 180° phase masking is avoided in accordance with the invention. Provision for regions of an additional value of phase delay by this means would require an additional mask layer as well as an attendant additional lithographic step—costly in terms of statistically reduced device yield.

The invention provides for device fabrication by use of expediently prepared masks evidencing a multiplicity—even a continuum of phase delays—without need for additional lithographic delineation steps. Such masks, whether operating in the transmission or reflection mode, are fabricated by what might be regarded as a two-step process: 1. quantum or "digital" alteration of defined localized mask regions and 2. physical averaging of such alteration. In embodiments in which phase delay is the consequence of layer thinning alone, step 1 consists of local removal of layered material to yield apertured material and step 2 consists of backfilling of apertures (referred to as "expendable apertures") by induced flow of surrounding layered material. The result is a layer characterized by layer thickness variation yielding desired phase variation (in addition to pattern information entailed at that level). Apertures may be of a variety of shapes and sizes—in one embodiment take the form of circular holes of uniform thickness with distribution/density providing for desired material removal. Other aperture shapes, perhaps as suggested by ultimate device features, include slits, areas defining pillars or mesas, etc. Variations may provide for added rather than removed material—always followed by an "averaging" step in which, in this instance, height of patterned added material is caused to flow.

A particularly significant aspect of the invention concerns the ability with which expendable features may be backfilled to the extent required (for avoiding meaningful, device-functional retention in the final pattern) while retaining device pattern-delineation features as well as non-device features included on the mask as compensating information. A particular example of the latter is a grating for lessening of unwanted brightness variation in the final pattern. The convenience of $\approx$ fourth power dependence of flow rate of filling material as related to distance to be traversed expedites separation of the two (separation of features to be retained from those to be filled)—permits differentiation as between "large" dimensioned features to be retained and "small" dimensioned features to be filled. Nevertheless, some degree of filling, to result in lessened surface relief amplitude, is to be expected for retained features. The inventive teaching provides for minimization of this effect, in some instances, by over-designing a feature be retained to the extent necessary to result in desired relief dimensions following flow. Termination of the flow step may be by simple timing, or, in critical instances, by realtime monitoring. As an example of the latter, a diffraction grating of designedly excessive peak-to-trough height may be monitored to identify the processing end point in terms of desired diffraction amplitude. Other variations are described in the Detailed Description.

Rheological understanding leads to mask design rules. Briefly, backfilling may be regarded intellectually as also consisting of two steps. Initial flow is responsive to the high free surface energy of substrate revealed during pattern delineation. For appropriately chosen materials—yielding requisite small wetting angle—this first requirement is satisfied by a thin layer of flowing material (a layer thickness of $\approx 100$ Å or less). Subsequently flow, responsive to surface tension considerations, is strongly dependent on void dimensions—a dependency sufficient to permit backfilling of expendable apertures without significant optical effect on voids to be retained (on non-expendable apertures). The two considerations give rise to basis for both materials selection and design geometry.

Initial implications of the inventive teaching are expected to be in terms of projection-reduction imaging using UV delineating radiation. The principles are, however, applicable to contact (proximity) as well as 1:1 projection printing, and also to use of shorter wavelength electromagnetic radiation (e.g. radiation in the x-ray spectrum).

BRIEF DESCRIPTION OF THE DRAWING

The four-figure series presented are descriptive of successive steps in the fabrication of exemplary mask forms satisfying the inventive requirements.

DETAILED DESCRIPTION

Fundamental Considerations

Figure 1A:
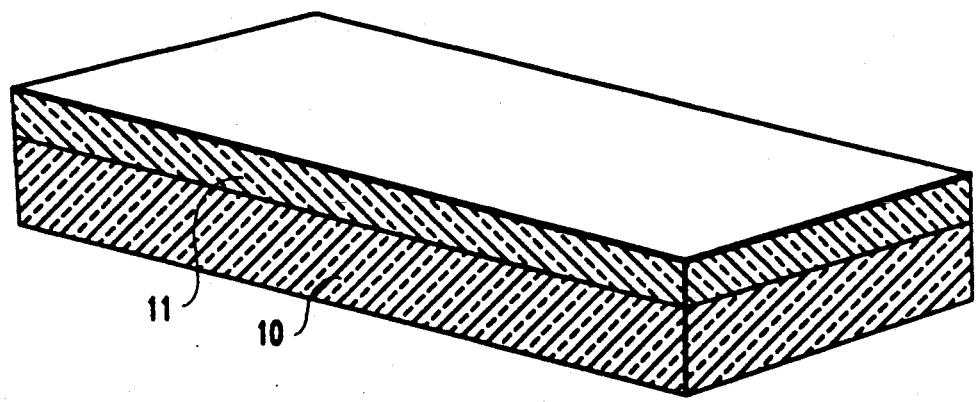
FIGS. 1A, 1B, 1C pertain to a structural approach in which a two-layer body region consisting of substrate and resist is directly shaped by deletion (by aperturing), so producing the expendable image, which is followed by flow to produce the final mask.

Fortunately, prior studies have considered many of the parameters needed for implementation of the inventive processes. Attention is directed, for example, to "Fundamentals of Topographic Substrate Leveling", authored by L. E. Stillwagon and R. G. Larson, as appearing at p. 5251, in *J. Appl. Phys.*, vol. 63(11), (Jun. 1, 1988). Information there contained as supplemented by other studies furnishes basis for various of the parameters usefully employed in accordance with the inventive teaching.

An experimentally-verified observation set forth in that reference is worthy of note—to some extent underlies detailed consideration of all aspects of the invention. Reference is made to the fourth power dependence on distance to be traversed for flowing material. As translated for the inventive purposes, the dependence serves as basis for retention of larger dimensioned features—e.g. the amount of material transported to the center of a 10 $\mu$m least dimensioned feature to be retained is $10^{-4}$ that for an expendable 1 $\mu$m feature. The resulting variation may itself be sufficient for process-differentiation, or, alternatively, may be supplemented by additional processing—e.g. by uniform exposure to result in selective etch-removal.

Material Selection

Fabrication in accordance with the invention entails backfilling of expendable apertures. Involved material compositions, e.g. of the material of the layer to be apertured as well as that of "substrate" material bared during aperturing, must first meet usual demands based on patterning. All such characteristics are well understood, and for most materials, well documented. While fundamental texts are well-known to the artisan, directions suggested by the Stillwagon et al article cited above, reflect one satisfactory direction with regard to resist choice.

Significant material characterization concerns back flow. The simplest approach is that discussed in conjunction with FIG. 1A in which the resist layer itself serves that function as well. Process simplification, inevitably desirable in terms of yield, may well be the commercial choice. Resist materials are well characterized and many have flow properties which are promising. Separation of functions, with resulting relaxed requirements, may yield to use of a second layer to which the pattern is transferred, to be flowed and yield the ultimate phase-dependent layer (thickness and/or surface). There are a variety of materials of insufficient actinic properties (relative insensitivity to delineating radiation) but of advantageous properties, e.g. with regard to stability in the presence of subsequent irradiation as well as mechanical properties. One group of materials are the "spin-on" glasses—commercially available low melting glasses that can be used to form layers by conventional spinning processes.

In general terms, desirable characteristics with regard to the material to be "thickness averaged" are apparent. Such characteristics include: chemical characteristics e.g. to result in requisite durability/reactivity both in the course of fabrication and subsequent use; physical characteristics assuring requisite dimensional stability e.g. as temperature/environment-dependent; optical properties to fulfill usual mask requirements, etc.

Additional requirements are imposed by fabrication in accordance with the inventive teaching. It is convenient to discuss such requirements in terms of (a) minima for attainment of parameters encountered in fabrication of the important category of sub-micron LSI, e.g. design rules 0.5 $\mu$m or less and (b) ranges with a view to including both lesser and greater dimensions and taking into account such processing and/or operating considerations as: permitted temperature rise, either as tolerable or desired; interfacial energy values as between substrate and backfill material to assure sufficiently low contact wetting angle to meet both the fundamental requirement and economic considerations.

A caveat—discussion here is largely in terms of the mask. While cost of mask fabrication is certainly of concern, it is far less important than such considerations entailing ultimate product. Increased mask cost is easily justified by even minor normalized product cost improvement.

In the major embodiment in which patterned material is made to flow, e.g. due to enhanced fluidity—perhaps even chemical phase change—a prime requirement entails flow characteristics. Viscosity, perhaps as decreased through temperature increase, must be sufficiently low to meet process time objectives. Surface tension of backfilling material in the fluid state must be sufficient again to meet time requirement in terms of degree of surface planarity to be attained. Both characteristics are temperature-dependent.

Initial wetting of surface bared in lithographic processing (either directly due to exposure as by evaporation, or indirectly by following development) is aided by a small wetting angle. Under general circumstances, this is no problem. Usual organic resist materials may be heated to temperature levels without adverse consequence such as to result in near-zero angles. In general, angles of 10° or more may suffice if other circumstances do dictate. It may be desirable to include an additional layer chosen with primary regard to providing a low wetting angle—such additional layer underneath and in contact with the resist or other layer to be back flowed.

As indicated, energetic requirements are generally satisfied by backflow to result in a wetting layer less than 100 Å in thickness—a consideration of minor optical consequence, or one that can be readily compensated for in mask design. Alternatively, layered material of such minimal thickness, may be easily removed without significant effect elsewhere on the mask, as by overall exposure to appropriate etchant.

With regard to backfilling following the initial wetting, it is fortunate that flow rate dependence on aperture size serves as effective basis for controlled processing. "Fundamentals of Topographic Substrate Leveling" cited above presents experimental verification for a concluded fourth power dependency on distance for flowing material in the course of backfilling. The specific conditions entail comparison as between two apertures, both baring underlying substrates of the same free energy and both surrounded by source material (layer material) of the same thickness and defining an interfacial boundary of the same configuration with respect to the aperture. There are a number of factors to be considered in a rigorous mathematical solution, e.g. including variation in the drive force responsible for flow—interfacial slope and layer thickness as dependent on difference in aperture dimension. Nevertheless, the order of magnitude of flow-transport during a significant part of the filling operation is as dictated by the fourth power dependency.

Above considerations give rise to prescription of expendable aperture size relative to non-expendable aperture size (e.g. relative to feature apertures to be retained, in contradistinction to expendable apertures to be backfilled). The material parameter controlling backflow is the ratio of the surface tension to the viscosity. Contemplated materials to be backflowed are likely glassy in the classical sense. Whether or not glassy from this standpoint, suitable materials desirably show a continuous dependence of properties of consequence with regard to varying temperature within the temperature range of consequence (within the temperature range within which flow is made to occur). Such materials, whether inorganic or organic, exhibit viscosity which decreases rapidly with temperature within a range suitable to the objective—from a minimum somewhat above the softening temperature to a maximum corresponding with retention of viscosity to the extent required for control.

Determination of appropriate backflow conditions—primarily temperature and time—may be pragmatic. In accordance with this approach, the mask at this stage is heated to a temperature and for a time sufficient to result in the desired backflow, following which the mask is cooled to terminate flow. A variation serves as well with respect to diffraction gratings. Monitoring is on the basis of the above while illuminating and sensing the intensity of diffracted radiation. Illumination is conveniently by a laser-generated beam, and detection may make use of a photo diode. It is unlikely that such results will need adjustment by virtue of any difference in wavelength relative to intended delineating radiation. If necessary, this may be readily calculated.

The Stillwagon et al reference (cited above) at p. 5252 sets forth a "dimensionless time" formula which may serve to determine end point on the basis of calculation. The formula is set forth:

$$T = t \frac{h_0^3}{w^4} \cdot \frac{\gamma}{\eta}$$

in which:
T is a dimensionless constant that may be obtained, for example, from FIG. 13 of the same reference
t = time of backflow (while on the assumption of constant temperature, real conditions characterizing the process approximate the assumption sufficiently—backflow time, ordinarily of the range of minutes for these processes together with termination by quenching (to essentially terminate flow within seconds) support this thesis
$h_0$ = the physical drive force for flow in terms of height difference at the border between material to be flowed and bared substrate to be filled
w = least dimension of the substrate region to be filled (in the instance addressed—that of equal line/space gratings—w = the breadth of a line or space within the concerned region
$\gamma$ = surface tension
$\eta$ = viscosity As an example, values are: $h = 0.5 \times 10^{-4}$ cm; $w = 0.25 \times 10^{-4}$ cm; T (as determined from FIG. 13) = $500 \times 10^{-4}$; t = 3 min. Substitution in the formula yields a ratio:

$$\frac{\gamma}{\eta} = 0.087 \text{ cm/sec.}$$

A representative surface tension value of 30 dynes/cm (a value characteristic of suitable resist materials) yields a viscosity of 345 poises.

Mask Design/Fabrication Considerations

The inventive approach places certain demands on the mask. Considerations determinative of the functioning device pattern are retained—in fact assured—by the invention. However, they must be taken into account in the design of features which are not to be part of the functioning device. Such non-device features ("compensating features") include both the expendable apertures to be flow-filled and any grating/checkerboard structures for meeting gray scale requirements (apertures which, while not filled, and while serving their intended function during image transfer, are of such dimensions and conformation as likely (and preferably) not to be represented in the final structure).

Creating a mask consists of two phases—designing a mask that will produce a particular image on the wafer by specifying the phase shift and the amplitude of the wavefront of the light coming through each point on the mask; and making a mask that has a particular phase shift and amplitude at each point.

It is a straightforward problem to compute the image that will be produced by light with a particular distribution of phase and amplitude as it leaves the mask. This computation can be performed fairly accurately and is discussed in textbooks on optics (see, for example, Reynolds, DeVelis, Parrent, Thompson, "Physical Optics Notebook", in *Tutorials in Fourier Optics*, pub. SPIE Optical Engineering Press, p. 27 (1989).)

However, the reverse problem—you want a particular pattern on the wafer and you want to know what phase delay and amplitude as introduced by the mask will produce that pattern—is a much more difficult problem. There may be several different answers that produce almost the same result. Also, it may be impossible to get the ideal pattern and we must be satisfied with the best compromise and defining what is a good compromise is usually a matter of judgment.

An important category of masks depend on a transparent layer made up of regions of varying thickness to produce specific phase shift in transmitted or reflected light at each point. The mask is generally created by using an electron beam to expose an electron resist such that the resist is completely removed at certain points and remains at other points. The pattern in the electron resist is thereafter transferred into another material of appropriate physical properties to satisfy flow requirements (e.g. of appropriate softening temperature and viscosity).

It is convenient to discuss relevant mask dimensions. Discussion is conveniently discussed in terms of a future device generation built to design rules of $\approx 0.35$ μm (on the assumption of continued 5× reduction projection, this results in 1.75 μm least dimension on the mask):

1. Expendable apertures of least dimension 0.25 μm on the mask would be seven times smaller than 1.75 μm features, and a 2,401 × fill rate relative to device features.
2. Gray scale is produced by diffracting light out of the system. The gratings or checkerboard patterns that produce the gray scale are of diffraction-determinative dimensions of the order 0.75 to 1 micron (for $\lambda = 0.365$ μm), and the back fill ratio for 0.25 μm expendable features is from 81× to 256×.

Minimum features that are to be printed on the wafer, i.e. in accordance with permitted design rules, will have a dimension of the order:

$$\text{Size (on wafer)} = \frac{K_1 \lambda}{NA}$$

in which:
The corresponding size of such feature on the mask is in accordance with the linear reduction factor of the mask-to-wafer transfer system.
Reduction factor of 5 is common for projection systems now in prevalent use.
$\lambda$ = wavelength of delineating radiation
NA = numerical aperture of the optical system
$K_1$ is a constant Accordingly, for a reduction factor of 5, the minimum feature size on the mask is of dimension, 2 μm, corresponding with 0.4 μm feature size on the wafer. Mask features, expendable apertures and grating lines as well as pattern features are often, in effect, larger, than that calculated by the formula, as viewed on the mask. This is a consequence of teachings of the companion case Ser. No. 07/673,614 cited above. Increased size of mask features is the consequence of surrounding regions of varying phase and gray scale as used to increase feature edge acuity, e.g. to reduce fringing and other artifacts of interference.

The initial thickness of the concerned layer is normally one or an integral number of wavelengths to afford maximum versatility—to permit attainment of any of the entire range of phase delay values as corresponding with layer thinning. This initial thickness is:

$$\frac{\lambda}{n-1}$$

in which:
$\lambda$ = wavelength of delineating radiation
n = index of refraction For example, at the mercury I line ($\lambda = 365$ μm for a layer of glassy material of n = 1.6,) the initial thickness is about 61 μm. Material removal and flow in accordance with the invention, accommodates any desired phase delay.

The Drawing

Figures presented are exemplary of likely commercial versions of the invention. All share the overall objective—that of expeditious fabrication of a mask adapted for precisely controlling the image front as received on an article being fabricated—particularly with regard to phase angle of the delineating radiation within the front so as to improve resolution as detailed above. Fabrication of the entirety or of relevant portions of the mask, in accordance with the invention, invariably involves two fundamental procedures: 1. that of "digital" removal of material within regions extending through the entirety of the "resist" layer, with removed regions of such cross-sectional dimension and distribution as to assure accomplishment of the objective of; 2. "averaging" of the stepwise variations, resulting directly or indirectly by digital removal, by a processing step consisting of or including material flow. In the simplest embodiment, such flow, of material surrounding removed regions, itself accomplishes the overall objective. Other embodiments provide for flow of material about apertures or within protuberances resulting from resist pattern transfer; perhaps into underlying material; perhaps into overlying subsequently deposited material (as by liftoff); perhaps in the form of solute material retained after removal of patterned—sometimes flow-filled—solvent material.

Figure 1B:
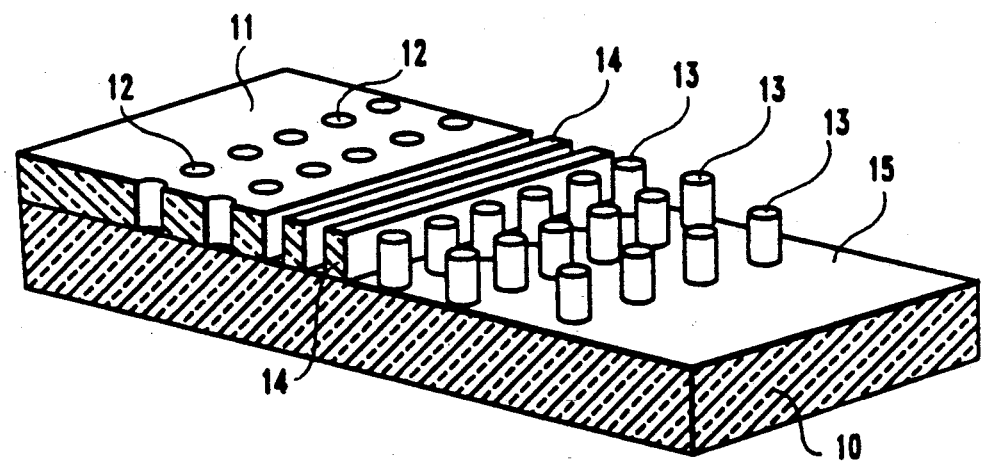
Figure 1C:
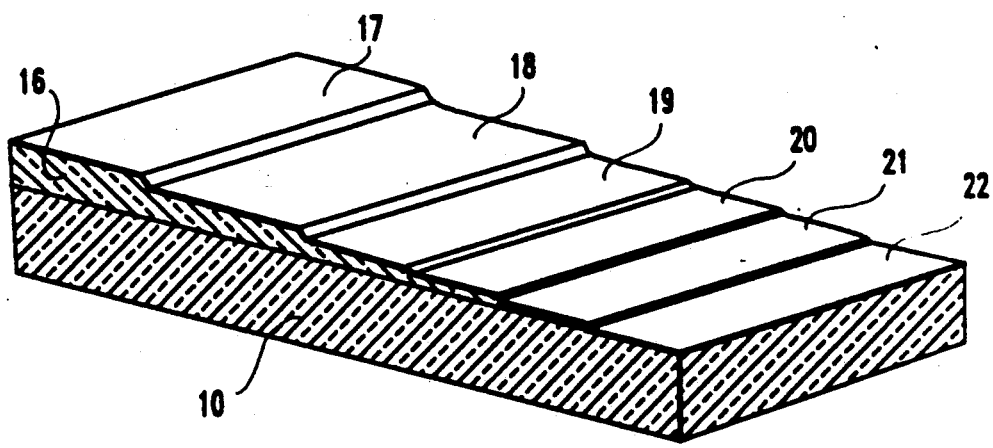

FIGS. 1A-1C are exemplary of the least complex form of fabrication process of the invention—that in which digital patterning as well as backflow-filling occur within a single, initially presented "resist" layer. (For these purposes the term "resist" is defined in its most generic sense—that of patternability to result in selective "resisting" of subsequent processing, e.g. aperture-patterning as by removal or retention (perhaps supplemented by material addition) to enable transfer of either tone of the resist pattern to the wafer. The term, "resist", is intended to include material which is patterned responsive to the delineating energy itself, e.g. by evaporation, as well as responsive to subsequent or simultaneous development.

FIG. 1A depicts the starting body consisting of substrate 10 and supported resist layer 11. While not intended as limiting, exposition is aided by reference to state-of-the-art fabrication in accordance with which substrate 10 may be of 6"-8" in lateral dimension and of a thickness of a fraction of an inch, all as required for processing expedience and rigidity and other mechanical properties. Material both of substrate 10 and resist 11 depend upon a number of familiar considerations. For example, if the mask is to operate in the transmission mode, then the substrate must be sufficiently transparent to be masked. If the mask is to operate in the reflection mode, e.g. to mask-delineate energy in the x-ray spectrum, substrate material is chosen solely with regard to mechanical properties.

The starting body of FIG. 1A is then pattern-delineated, likely by electron beam writing (e.g. by use of Electron Beam Exposure System writing—see "Introduction to Microlithography", ed. by L. F. Thompson, C. G. Wilson and M. J. Bowden, *ACS Symposium Series*, (1983) at p. 73, for a general description of this commonly used patterning approach). An alternative makes use of a "master" mask, itself likely fabricated by use of electron beam writing, image transfer from a master entails mask-illumination by unpatterned radiation, e.g. raster scan or flood electromagnetic radiation in the UV or x-ray spectra.

It is an important aspect of the invention that a single delineation step may result both in device-function patterning as well as patterning of expendable or other features or other compensation features for which replication in the final device is not required—is ordinarily to be avoided. Stated differently, features concerned not with device function, but with device-fabrication expediency, e.g. expendable apertures, diffraction gratings for imposing gray scale, may be delineated in the single step in which relevant device-function pattern-delineation results. This aspect of the invention, in permitting both operations in a single step with a single mask layer avoids further yield loss associated with additional masking steps.

Material of which resist layer 11 is constituted, again depends upon intended mask mode (reflection or transmission), and, the likely related nature of device-delineating radiation to be masked. From the standpoint of the inventive mask fabrication, resist material, whether patterned by the delineating energy itself or by attendant development, must have an additional property not ordinarily required in a resist. For the embodiment shown, resist, once aperture-patterned, must have flow properties, however induced, to result in timely flow to accomplish the inventive filling requirement.

FIG. 1B depicts the structure of FIG. 1A following pattern delineation. Selective removal of material of layer 11 has resulted in expendable feature holes 12, pillars 13 and rectangular line protuberances 14, to reveal substrate surface 15.

In FIG. 1C flow of resist material as surrounding apertures 12 and as constituting protuberances 13 and 14, perhaps as induced by temperature increase, perhaps by other means, has resulted in now averaged layer thickness. Associated flow has produced a resist layer (constituting a portion of the functional masking layer 16 of five thicknesses: that of region 17 as initially deposited, region 18 as resulting from flow to substantially fill equally dimensioned/spaced apertures 12; that of region 19 resulting from flow-filling of rectangular apertures embracing protuberances 14; that of regions 20 and 21, resulting the designedly limited flow, as elsewhere to result in local averaging (including that of thinner region 21 as produced from the lesser total material retained in the form of more widely spaced pillars yielding flow material; and finally, that of region 22 which is essentially unfilled—essentially as bared during the delineation responsible for other patterning. (As elsewhere discussed, region 22 in fact supports a very thin layer of resist material (not shown), perhaps 100 Å in thickness as dictated by satisfaction of energetic requirements imposed by choice of substrate 10 to present a bared surface of sufficiently high energy to permit the low angle wetting required by the invention.)

For simplicity, FIGS. 1A-1C depict portions of a mask being fabricated with such portions concerned primarily, if not solely, with the compensation patterning of the invention. As indicated, it is an advantage of the invention that device-pattern delineation may be yielded by the same mask simultaneously with pattern variations of the invention (as directed to e.g. resolution improvement of device pattern). Accordingly, the broken section depicted is likely but a portion of a mask-in-fabrication which also includes such additional device-pattern information.

As shown, FIGS. 1A-1C likely depicts a transmission mode mask being fabricated (although appropriate choice of material of resist layer 11 permits use in the reflection mode). While not shown, the surface morphology corresponding with flow-imposed variations on resist layer thickness, even for transparent resist, may be utilized in the reflection mode by addition of a metallic or other reflective coating (not shown), as by vapor deposition. A further alternative depends upon an underlying reflective layer (not shown), in this instance with variable path length and associated changed phase delay involving round-trip passage through the processed coating (consisting of regions 16-20).

FIGS. 2A-2D depict a variant in which initial resist patterning is transferred to an underlying layer and in which the now-patterned underlying layer is subsequently caused to flow much in the manner depicted and discussed in FIG. 1C. A purpose is to separate desired actinic properties of the resist from desired mask properties of the delineating material—e.g. to substitute a relatively stable/durable inorganic glassy material for the resist as finally processed.

Figure 2A:
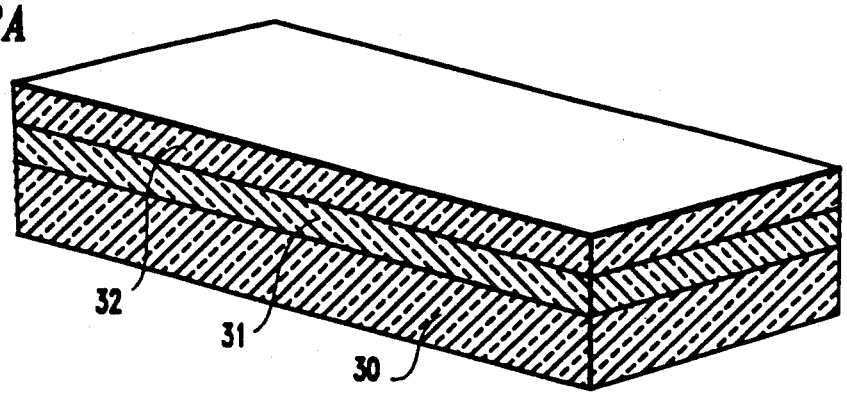
FIGS. 2A-2D are somewhat similar to FIGS. 1A-1C but provide for transfer of the developed expendable image from the resist to an underlying material layer, again followed by material flow.
Figure 2B:
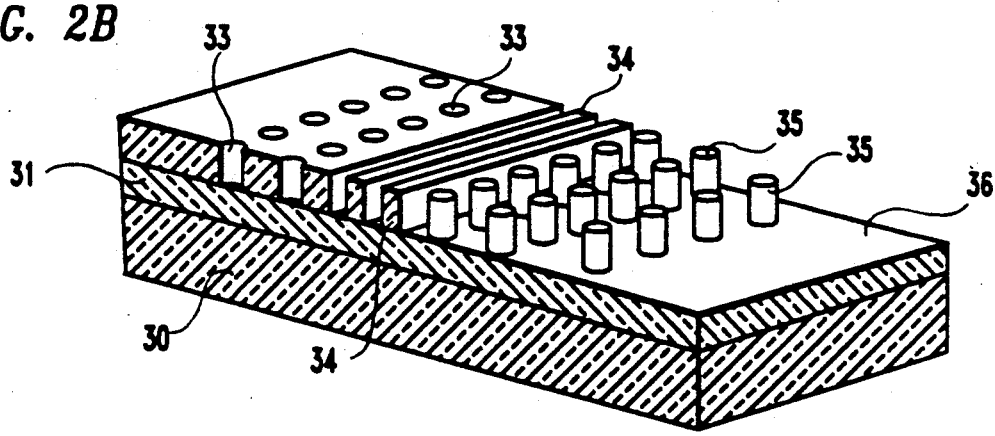

FIG. 2A shows a substrate 30 supporting, in succession, a layer 31 to ultimately serve as the mask pattern layer, in turn supporting resist layer 32. In FIG. 2B pattern delineation and development—again likely by electron beam direct-write—has produced features in the form of apertures 33, rectangular protuberances 34 and pillars 35, while revealing substrate surface 36—in this instance, surface of layer 31.

Figure 2C:
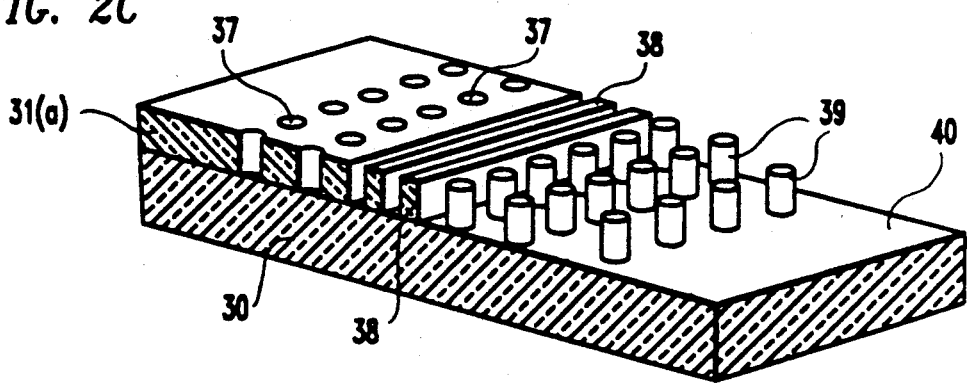

In FIG. 2C the pattern has been transferred to layer 31, now designated layer 31a to result in a positive image, again consisting of holes and protuberances 37, 38 and 39, while revealing surface 40, in this instance, surface of substrate 30. Positive replication of features 33, 34, 35 as 37, 38 and 39 may be the consequence of use of positive tone resist constituting layer 32.

Figure 2D:
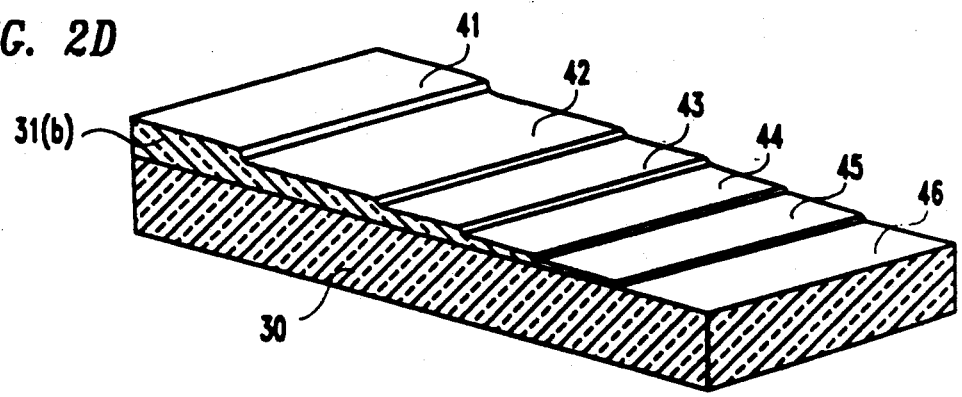

In FIG. 2D flow, in this instance of material of layer 31—e.g. of low melting glass, perhaps as induced by increasing temperature, has again resulted in six discrete regions in a patterned layer now designated 31b. In order of thickness such regions are denoted 41, 42, 43, 44, 45 and 46, the latter devoid of supported material 39 except to the angstroms-magnitude (e.g., as discussed, perhaps $\approx 100$ Å) thickness required to satisfy energetic requirements resulting from exposure of the high energy surface.

Figure 3A:
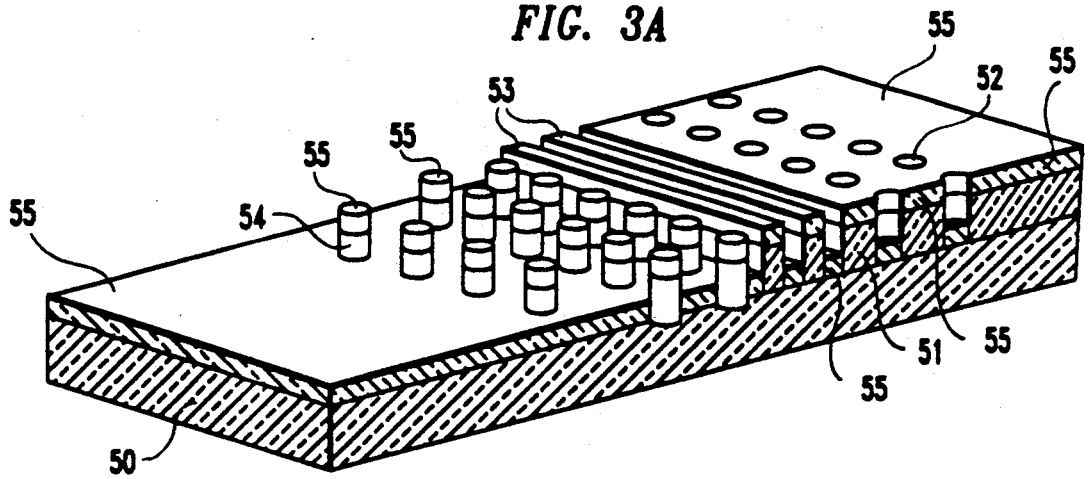
FIGS. 3A-3C depict fabrication of a mask in which the final structure is made up of added material as deposited on an already-pattern delineated layer, followed by liftoff to leave a mask pattern primarily or solely dependent on such deposited material.
Figure 3B:
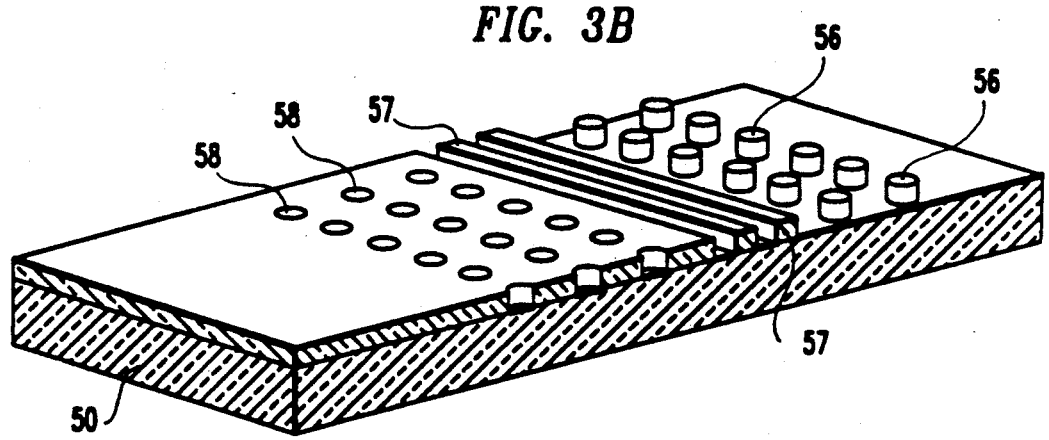
Figure 3C:
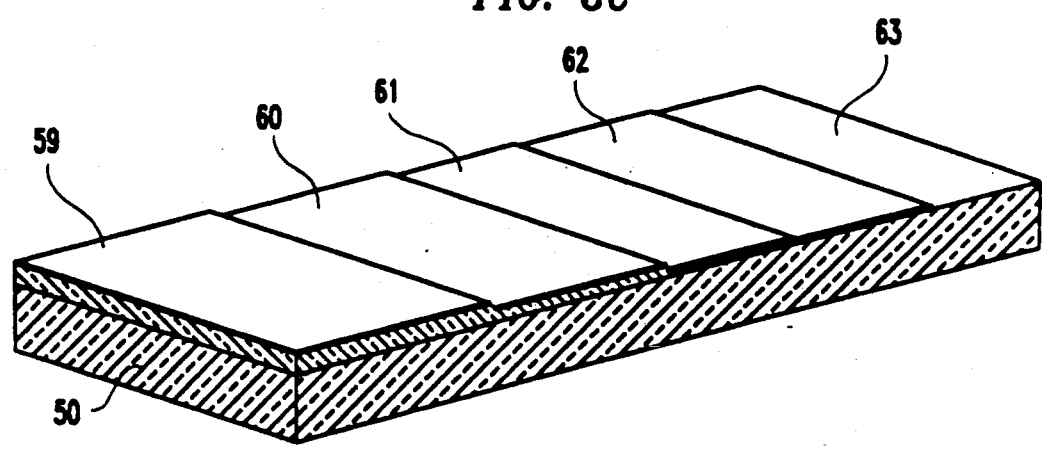

FIGS. 3A-3C depict yet another variation in which digital removal of resist material is ultimately followed by flow-filling of expendable apertures (to result in layer thickness averaging).

In this example, FIG. 3A depicts a mask-in-fabrication at the level of that of FIG. 1B or of 2C. As shown, substrate 50 supports a delineated layer of material 51 (e.g. of resist material of layer 11 of FIG. 1A or of e.g. glassy material of layer 31a of FIG. 2C). Layer 51 as patterned includes holes 52, rectangular protuberances 53 and pillars 54. At this stage in fabrication, deposition conditions, uniform across the latent device portion shown, has resulted in addition of layer regions 55. Choice of metallic or other reflective material serving in layer 55 satisfies conditions for one form of reflection mask in accordance with the invention.

In FIG. 3B, liftoff of material 51 has resulted in retention only of regions 55 in contact with substrate 50. Replication brought about by liftoff as shown, is, in meaningful sense, of negative tone so that holes 52 are now represented by pillars 56, protuberances 53 by troughs 57 and pillars 54 by apertures 58.

In FIG. 3C, flow, of material, of properties and under conditions discussed in conjunction with preceding figures, has resulted in local thickness averaging, thereby producing regions 59, 60, 61, 62 of successively diminishing thickness, and finally substantially bared region 63 (always allowing for energetically dictated initial flow, likely of angstroms thickness range).

Figure 4A:
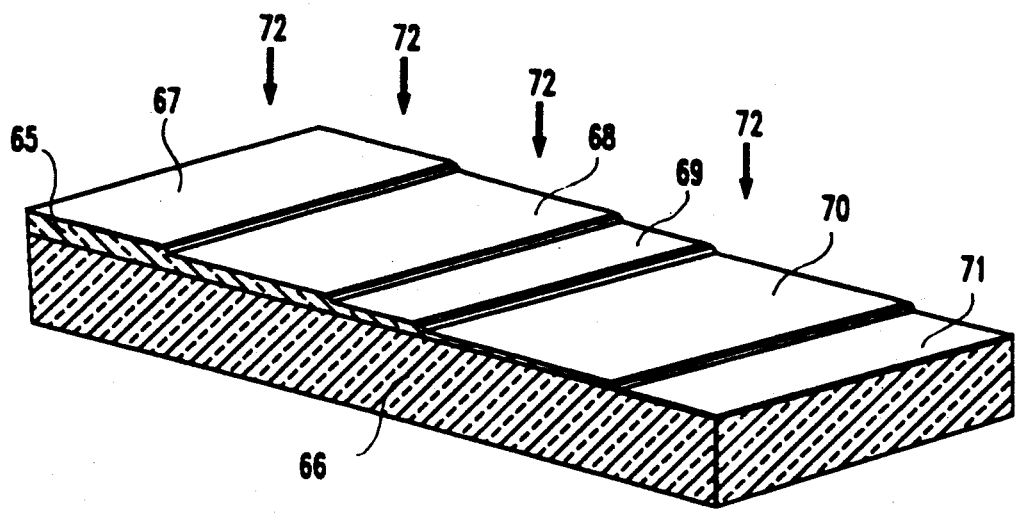
FIGS. 4A-4B are illustrative of fabrication of a reflective mode mask which depends upon e.g. metal vapor which, following deposition on an already defined/backflowed layer, is caused to diffuse into and saturate such layer material, following which the host layer material is removed so that only metal remains.
Figure 4B:
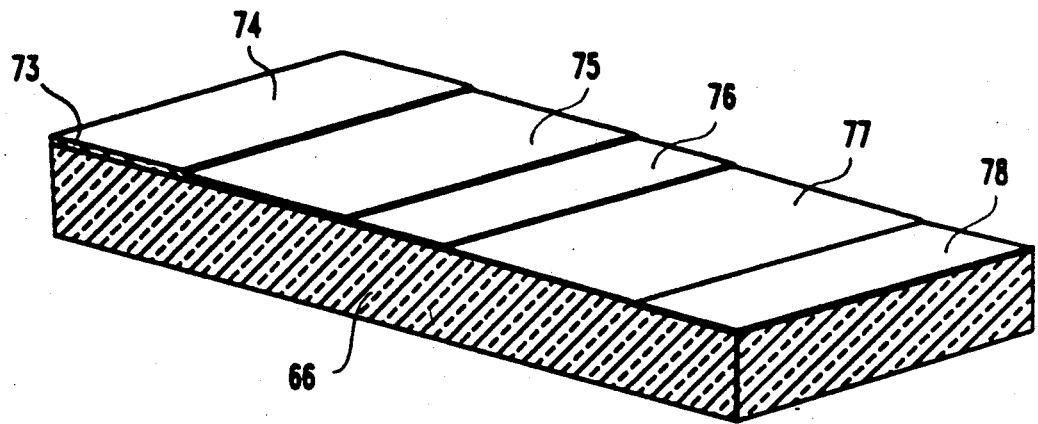

FIGS. 4A and 4B, in common with other figures presented, illustrate mask fabrication in which many-leveled, or even continuously varying, phase delay values, are provided by flow, responsive to digital alteration. As shown, FIG. 4A is at a stage at which the uppermost layer 65 as supported by substrate 66 has been caused to flow resulting, for example, in the structure shown at the stage of FIG. 1C. Flow has produced five discrete regions of reducing thickness, here denoted 67, 68, 69, 70 and 71. At this stage, the backflow-filled structure is exposed to vapor 72, e.g. metal vapor under conditions and for a time sufficient to saturate resist layer 65 throughout its entire thickness.

In FIG. 4B the resist host (or matrix) has been removed, e.g. by dissolution or volatilization under conditions to leave metal layer 73 with such layer characterized by regions 74-78 such regions are being of the same relative thicknesses as those of regions 67-71, respectively, to the extent that uniform saturation was attained. Under the processing conditions responsible for the device depicted, vapor 72 is not deposited on free surface 71, but is retained only by solution in host material of layer 65. Under these conditions, region 78 is not coated.

In the instance in which vapor 72 is of metal which is reflective with respect to device fabrication-delineating energy, the product—the mask—is reflective and evidences controlled differential path length to produce the desired stepped phase delay values for such energy. In many instances, the approach offers precise control of control of extremely thin layered material—a degree of control not so easily realized by means of physical flow.

Device Delineation

It is useful to consider operating characteristics of the mask as constructed in accordance with the invention. A primary consideration relates to wavelength of the radiation to be used in device fabrication. In this section relevance of this aspect to the invention is discussed.

The purpose of first generation phase masks will be to obtain higher resolution and image quality with presently used delineating energy. This includes energy in the visible spectrum: e.g. the mercury G line at 4360 Å; in the near UV spectrum, e.g. the mercury I line at 3650 Å; in the deep UV spectrum, e.g. the krypton fluoride excimer laser line at 2480 Å or the mercury 2540 Å line, and ultimately at still shorter wavelength, perhaps at the argon fluoride excimer laser 1930 Å line.

The invention is not wavelength limited. It will likely serve for use with delineating radiation in the x-ray spectrum—as used in projection or proximity printing. Co-filed U.S. application Ser. No. 595,341 filed Oct. 10, 1990, which is hereby incorporated by reference, describes and claims an effective projection system which may operate in the reduction mode, likely for the longer wavelength portion of the x-ray spectrum—e.g. within the 40 Å-200 Å range. It may serve also in x-ray proximity printing, thereby enabling use over the shorter portion of the spectrum as well (e.g. including the 9 angstrom-18 Å range). In the new technologies the same principles apply to masks for x-ray projection lithography in the 40 to 200 Å range. The techniques of mask making could also be used in x-ray proximity printing in the 9-18 Å range.

A significant degree of coherence of delineating radiation is required for contemplated projection systems providing for improved feature edge acuity through phase delay cancellation of edge-scattered radiation as well as of other attendant resolution-impairing effects. Illumination coherence concerns both temporal (longitudinal) coherence and lateral or spatial coherence. Temporal coherence is related to the bandwidth of the radiation and can be expressed in coherence length e.g. as expressed in terms of number of wavelengths. For meaningful interference to occur the phase difference between waves combining at a particular point must be less than the coherence length of the radiation. In cases of interest in phase masks, phase differences are seldom more than a few wavelengths. In these terms, coherence length available by use of illustrative sources mentioned, is sufficiently long as not to present a problem.

The other aspect is spatial or lateral coherence. This is characterized by the numerical aperture, NA, and the filling factor $\sigma$. If the source is a laser or an incoherent source at a distant point (at sufficient distance to serve as a point source), $\sigma=0$, and there is considerable lateral coherence. For a larger source (e.g., a point source that has been diffused), lateral coherence is less, resulting in larger $\sigma$. In ordinary lithography a low $\sigma$ produces sharper edges on small features but has ringing and interference effects so that a somewhat larger value of $\sigma$ is preferred—a value of $\sigma = \approx 0.5$ is generally found suitable. In a phase mask ringing is a significant concern, but, again, a finite value of $\sigma$—representing a compromise between ringing and edge definition—is useful.

Currently, phase mask systems are designed to work with existing cameras, e.g. with $\sigma = \approx 0.5$. Masks produced in accordance with the invention may make use of such $\sigma$ values. Conditions encountered are likely to result in compromise values which are somewhat smaller. Use of partially coherent light ($\sigma$ of finite value) averages out many effects of interference. Complete control of both phase and amplitude eliminates need for such averaging and permits optimization of edge acuity realizable by use of $\sigma=0$.

I claim:

1. Process for mask fabrication entailing a masking layer having a masking pattern defined in terms of delineation regions of differing properties to enable transfer of a transfer pattern to a transfer surface, to ultimately result in an ultimate pattern by means of transfer radiation in which such ultimate pattern has a least dimension smaller than 1 $\mu$m, in which the resolution of such transfer pattern is enhanced by provision of phase shifting characteristics in order to lessen resolution-decreasing effects, said characteristics designedly providing for relative phase shift for a portion of said transfer radiation as between different regions of said transfer surface, in which such masking pattern contains two types of information: (a) ultimate pattern information to be included in the ultimate pattern and (b) auxiliary transfer information not necessarily included in the ultimate pattern, Characterized in that the said masking layer is fabricated from a precursor masking layer which is apertured to produce a digital pattern defined by precursor aperture regions extending through the thickness of such precursor masking layer to reveal underlying material, said precursor regions being of least dimension no greater than 30% of the least dimension of ultimate pattern information, and in which such digital pattern is processed by a method including at least partially filling apertures by physical material flow.

2. Process of claim 1 in which resolution-decreasing is at least in part produced by diffraction-scattered radiation and in which the said characteristics designedly provide for 180° relative phase shift for a portion of said transfer radiation in which precursor regions include expendable regions being of least dimension no greater than 15% of the least dimension of ultimate pattern information and in which material flow results in substantial filling of expendable regions.

3. Process of claim 2 in which included precursor regions include non-printing regions larger than such expendable regions but sufficiently small as to be excluded from the final pattern.

4. Process of claim 3 in which such non-printing regions include features of such size and spacing as to diffract final pattern transfer radiation to the extent necessary to avoid its incidence on the transfer surface.

5. Process of claim 3 in which such non-printing regions comprise diffraction gratings.

6. Process of claim 1 in which said final pattern constitutes a functioning part of a discrete mask.

7. Process of claim 1 in which patterning is initiated by electron beam writing in a resist layer so as to selectively remove resist material to produce an aperture image.

8. Process of claim 7 in which an overlying layer is produced by material deposition on top of the aperture-patterned resist layer.

9. Process of claim 8 in which further processing includes liftoff of deposited material by removal of resist so as to produce an image defined by deposited material selectively retained in apertures.

10. Process of claim 9 in which selectively retained material is caused to flow to fill regions resulting from liftoff.

11. Process of claim 7 in which the aperture image includes expendable regions and in which resist material proximate to such expendable regions is caused to flow and fill such expendable regions.

12. Process of claim 11 in which the resulting reflow-patterned resist layer is exposed to a fluid serving as a source for solute for said resist layer under conditions as to saturate substantially the entirety of such layer.

13. Process of claim 12 in which the said resist is substantially removed to leave a patterned layer of solute.

14. Process of claim 13 in which a Distributed Bragg Reflector is constructed on top of the patterned layer of solute.

15. Process of claim 7 in which said aperture image is transferred to an underlying layer which is processed to result in the said masking layer.

16. Process of claim 15 in which processing of the underlying layer comprises material removal to produce an aperture image including expendable regions which are filled by flow.

17. Process of claim 16 in which the underlying layer consists essentially of a glassy layer which is increased in temperature to cause flow and so fill the expendable regions.

18. Process of claim 1 in which backflow produces a masking layer comprising at least three discrete regions of sufficiently differing thickness and associated differing surface morphology to result in a phase difference of at least 10° from each other with regard to transfer radiation.

19. Process of claim 1 in which backflow produces a masking layer comprising a continuum of layer material of varying thickness and associated differing surface morphology to result in a maximum variation in phase difference of at least 10° with regard to transfer radiation within the continuum.

20. Process of claim 18 or 19 including replicating to yield a separate mask of negative tone as replicated.

21. Process of claim 20 in which replicating is by hot-pressing.

22. Process of claim 20 in which replicating is by casting.

23. Process of claim 18 or 19 in which the mask to be replicated is modified by selective addition or subtraction of material to improve the surface to be replicated.

* * * * *